United States Patent [19]

Saito et al.

[11] Patent Number: 4,993,046
[45] Date of Patent: Feb. 12, 1991

[54] CODED MODULATION COMMUNICATION SYSTEM

[75] Inventors: Yoichi Saito; Yasuhisa Nakamura; Satoru Aikawa; Hitoshi Takanashi, all of Kanagawa, Japan

[73] Assignee: Nippon Telegraph and Telephone Corporation, Tokyo, Japan

[21] Appl. No.: 357,573

[22] Filed: May 26, 1989

[30] Foreign Application Priority Data

Jun. 24, 1988 [JP] Japan ................................. 63-154923
Oct. 24, 1988 [JP] Japan ................................. 63-266249

[51] Int. Cl.$^5$ ......................... H04L 5/12; H04L 23/02
[52] U.S. Cl. .................................... 375/39; 371/43; 341/95; 341/100
[58] Field of Search ................. 375/39; 371/30, 43–47; 341/94, 95, 100

[56] References Cited

U.S. PATENT DOCUMENTS

| 4,077,021 | 3/1978 | Csajka et al. | 375/67 X |
| 4,520,490 | 5/1985 | Wei | 375/39 X |
| 4,534,040 | 7/1985 | Thapar | 375/39 |
| 4,586,182 | 4/1986 | Gallager | 375/39 X |
| 4,713,817 | 12/1987 | Wei | 375/39 X |
| 4,748,626 | 5/1988 | Wang | 375/17 X |

OTHER PUBLICATIONS

"Trellis-Coded Modulation with Redundant Signal Sets Part I: Introduction", Ungerboeck, IEEE Communications Magazine, Feb. 1987, vol. 25, No. 2, pp. 5-11.
"Trellis-Coded Modulation with Redundant Signal Sets Part II: State of the Art", Ungerboeck, IEEE Communications Magazine, Feb. 1987, vol. 25, No. 2, pp. 12-21.
"Channel Coding with Multilevel/Phase Signals", Ungerboeck, IEEE Transactions on Information Theory, vol. IT-28, No. 1, Jan. 1982, pp. 55-67.

Primary Examiner—Benedict V. Safourek
Assistant Examiner—Tesfaldet Bocure
Attorney, Agent, or Firm—Armstrong, Nikaido, Marmelstein, Kubovcik & Murray

[57] ABSTRACT

In Trellis coded modulation system in which an input digital signal in parallel form is encoded by a convolutional encoder which adds an additional bit to the input digital signal for error correction purpose, and a mapping circuit designated amplitude and phase for each symbol for QAM signal, the number of parallel bits at output of said convolutional encoder is the same as the number of parallel bits of an input digital signal. An input digital signal is first rate converted so that m+n bits in every T period is converted to m bits in every T' period, where T'=(m/(m+n)).T. The convolutional encoder adds n number of bits so that the total number of parallel bits is m+n, which is applied to the mapping circuit. In a receive side, a received signal having m+n bits in every T' period is decoded through an error correction decoder which provides m bits in every T' period, then, the decoded signal is rate converted to m+n bits in every T period. So, the number of parallel bits does not increase in spite of convolutional encoding, but a transmission rate is a little increased. The coding gain in the present invention is improved since the number of levels of the QAM signal is not increased although the bandwidth of the signal is a little increased because of the higher clock rate.

9 Claims, 6 Drawing Sheets

PRIOR ART

16 QAM

CODED 32 QAM

Fig. 4

| | | | | |
|---|---|---|---|---|
| $a_1$ | $S_{11}$ | $S_{21}$ | $S_{31}$ | |
| $a_2$ | $S_{12}$ | $S_{22}$ | $S_{32}$ | |
| $a_3$ | $S_{13}$ | $S_{23}$ | $S_{33}$ | |
| $a_4$ | $S_{14}$ | $S_{24}$ | $S_{34}$ | |
| $a_5$ | $S_{15}$ | $S_{25}$ | $S_{35}$ | |
| $a_6$ | $S_{16}$ | $S_{26}$ | $S_{36}$ | |
| $a_7$ | $S_{17}$ | $S_{27}$ | $S_{37}$ | |
| $a_8$ | $S_{18}$ | $S_{28}$ | $S_{38}$ | |
| | T | T | T | |

| | | | | |
|---|---|---|---|---|
| $b_1$ | $S_{11}$ | $S_{18}$ | $S_{27}$ | $S_{36}$ |
| $b_2$ | $S_{12}$ | $S_{21}$ | $S_{28}$ | $S_{37}$ |
| $b_3$ | $S_{13}$ | $S_{22}$ | $S_{31}$ | $S_{38}$ |
| $b_4$ | $S_{14}$ | $S_{23}$ | $S_{32}$ | $S_{41}$ |
| $b_5$ | $S_{15}$ | $S_{24}$ | $S_{33}$ | $S_{42}$ |
| $b_6$ | $S_{16}$ | $S_{25}$ | $S_{34}$ | $S_{43}$ |
| $b_7$ | $S_{17}$ | $S_{26}$ | $S_{35}$ | $S_{44}$ |
| | T' | T' | T' | T' |

CODED MODULATION COMMUNICATION SYSTEM

BACKGROUND OF THE INVENTION

The present invention relates to a coded-modulation system, in particular, relates to a Trellis-coded modulation system which maps a coded signal considering both the error in radio space and the error correction capability.

A prior Trellis-coded modulation system is described in "Trellis-coded modulation with redundant signal sets" by G.Ungerboeck, IEEE Com. Mag. February 1987, pp 5–21, in which a convolution coding circuit for error correction adds n number of redundant bits to m number of input bits, and (m+n) number of output bits are modulated in a $2^{m+n}$ levels multi-level modulator.

Figure 1:
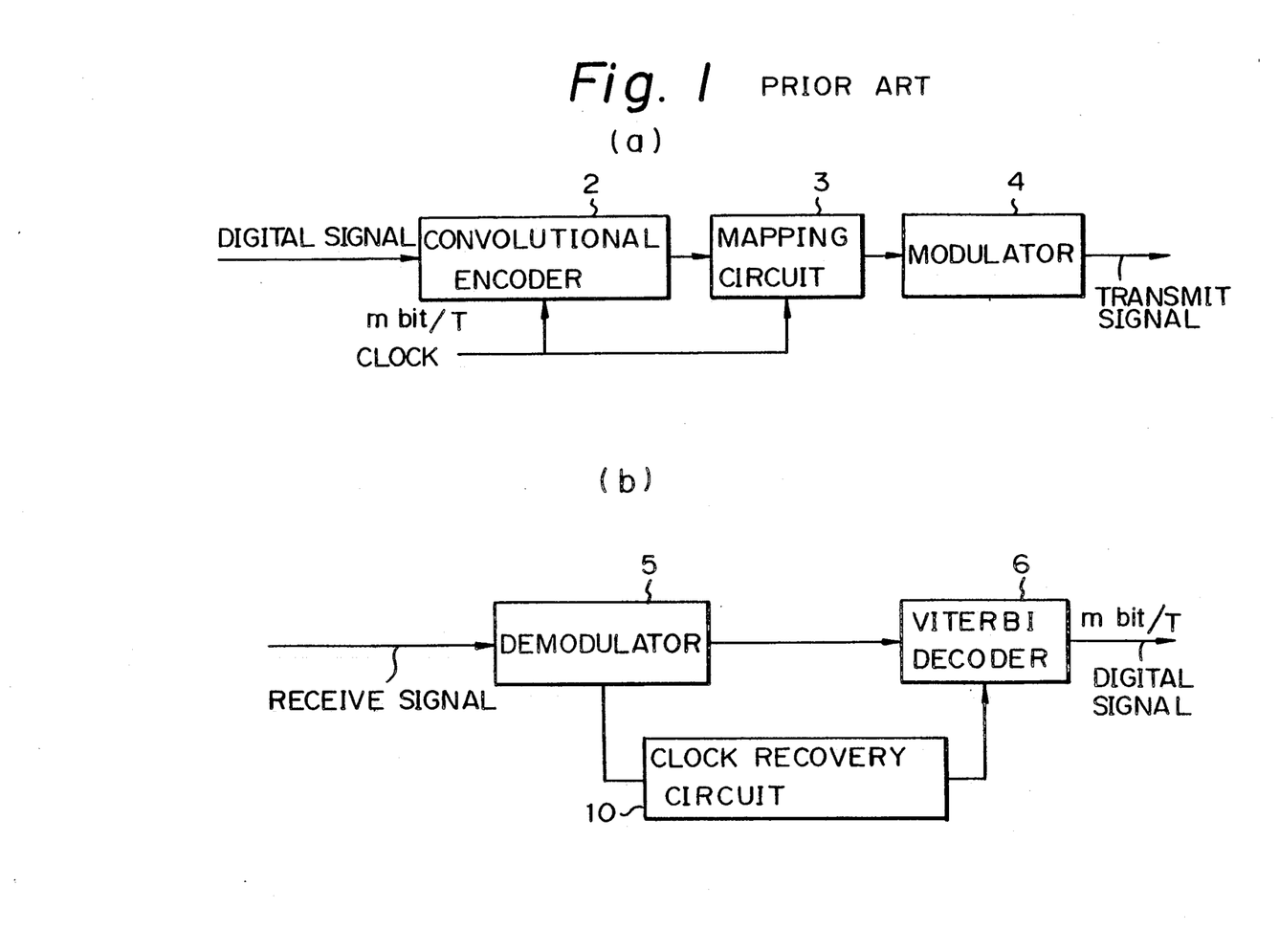
FIG. 1 is a block diagram of a prior coded modulation system.

FIG. 1 shows a block diagram of a prior Trellis-coded modulation circuit, in which FIG. 1A is a transmit side, and FIG. 1B is a receive side. In the figure, the numeral 2 is an encoder, 3 is a mapping circuit, 4 is a modulator, 5 is a demodulator, 6 is a decoder, and 10 is a clock recovery circuit.

In a Trellis-coded modulation system, an input signal is encoded for each symbol so that Euclid length between symbols is the maximum on a signal space with the combination of an error correction technique and a modulation-demodulation technique. The Trellis-coded modulation system provides the higher coding gain than a prior error correction system which encodes each symbol so that the Hamming length between symbols is the maximum.

In FIGS. 1A and 1B, an input digital signal is applied to the encoder 2 which is a convolutional encoder for error correction, and adds some redundant bits to the input digital signals. The output of the encoder 2 is applied to the mapping circuit 3 which relocates each symbol through Set-Partition. The encoder 2 and the mapping circuit 3 operate with the common clock rate. The output of the mapping circuit is transmitted through the modulator 4. On a receive side, the received signal is demodulated by the demodulator 5 the output of which is applied to the decoder 6, which effects the error correction for the error correction code encoded by the encoder 2. The output of the decoder 6 is an output digital signal. The decoder 6 operates with the clock signal of m bit/T rate by the clock recovery circuit 10 which recovers the clock signal at the output of the demodulator 5. It should be noted in FIGS. 1A and 1B that the circuits, including the encoder 2, the mapping circuit 3, the demodulator 5 and the decoder 6 operate with the common clock signal of the clock rate m bit/T, where m is an integer larger than 2, and T is a period of each symbol.

However, a prior Trellis-Coded modulation system has the disadvantage that the improvement of the coding gain is not enough as described below.

Figure 2:
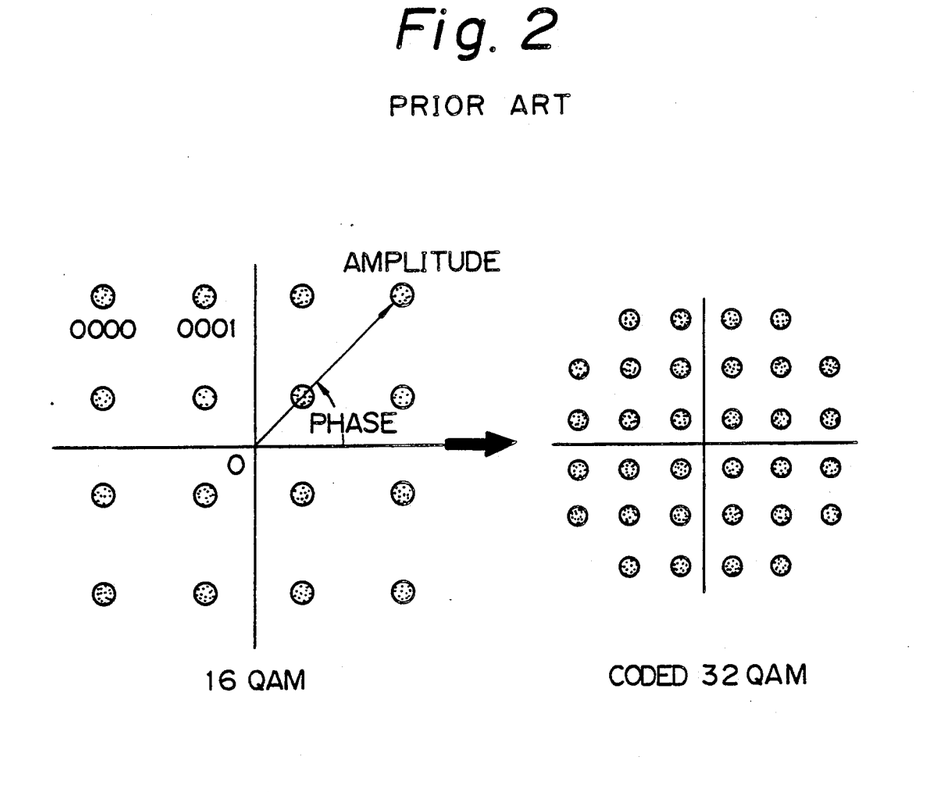
FIG. 2 shows the signal spacing of a prior 16QAM signal and a prior 32QAM signal having the same mean power as that of 16QAM signal.

When m=4 (which means that an input signal has 4 ( - bits), and n=1 (which means that a single redundant bit is added), the number of levels increases from 16QAM to 32QAM as shown in FIG. 2, in which each dot shows a symbol, the length between the center O and each dot shows the amplitude of the symbol, and the angle between the horizontal line and the line between the center O and the symbol shows the phase of the symbol. It should be appreciated in FIG. 2 that the length between symbols in 32QAM signal is about half of that of 16QAM signal when the mean power of 16QAM signal is the same as that of 32QAM signal.

The decrease of the symbol spacing deteriorates the necessary C/N (carrier to noise ratio) for providing the predetermined error rate. Therefore, the decrease of the symbol spacing deteriorates the coding gain considerably.

Further, the increase of the levels in the Trellis-coding modulation system demands the more accurate operation of a modulator and a demodulator since less error in amplitude and phase of a QAM signal is allowed.

SUMMARY OF THE INVENTION

It is an object, therefore, of the present invention to overcome the disadvantages and limitations of a prior coded modulation system by providing a new and improved coded modulation system.

It is also an object of the present invention to provide a coded modulation system which provides the higher coding gain with a simple modulator and/or a simple demodulator.

The above and other objects are attained by a coded modulation system having a transmitter for providing coded modulation signal and a receiver for obtaining reproducing signal by demodulating and decoding a signal received from said transmitter; said transmitter comprising; a first rate converter which receives an input digital signal in parallel form having a first number of bits in every first period for converting clock rate of said digital signal with first clock rate to second clock rate which is higher than said first clock rate, and providing a converted output signal in parallel form having a second number of bits in every second period wherein said first number is larger than said second number, and said first period is longer than said second period; a convolutional encoder coupled with output of said first rate converter for encoding said second number of bits by adding an additional bit so that total number of parallel bits at output of the convolutional encoder is the same as that of said first number; a mapping circuit coupled with output of said convolutional encoder for determining amplitude and phase of each signal on a signal space; and a modulator coupled with output of said mapping circuit for providing modulated signal for transmission; and said receiver comprising; a demodulator for receiving a signal from said transmitter and demodulating a receive signal; a decoder coupled with output of said demodulator for decoding the signal encoded by said convolutional encoder and providing decoded digital signal in parallel form having said second number of bits in every said second period; a second rate converter coupled with output of said decoder for converting clock rate of decoded digital signal from said second clock rate to said first clock rate and providing a digital output signal in parallel form having said first number of bits in every first period.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

FIG. 3A shows a transmitter according to the present invention, and FIG. 3B shows a receiver according to the present invention. In those figures, the numeral 1 is a first rate converter which receives a digital input signal in parallel form, and converts the bit rate so that the output rate is higher than the input rate. The rate converter 1 receives m+n bits of an input signal in parallel form for every T period, and provides m bits of an output signal in parallel form for every T' period, where T' is smaller than T. In the embodiment where m=7 and n=1, the rate converter 1 receives 8 bits in parallel form in every T period, and outputs 7 bits in parallel form in every T' period. In that case, the relation $T' = (m/(m+n)) \cdot T = (\frac{7}{8})T$ is satisfied.

Figure 4:
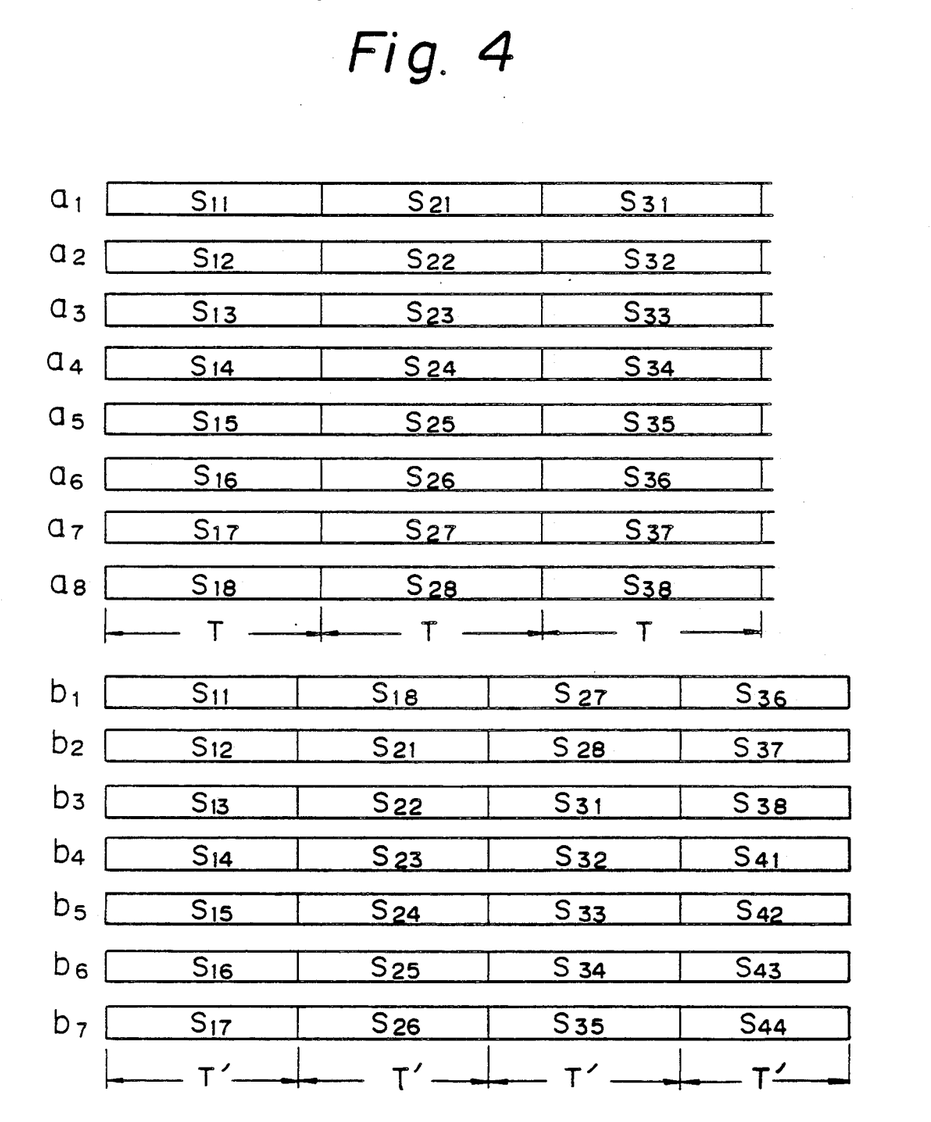
FIG. 4 shows the operation of a rate converter 1 in FIG. 3.

FIG. 4 shows the operation of an example of the rate converter 1, in which the rate converter 1 receives 8 channels of parallel signals $a_1$ through $a_8$ in every T period, and provides 7 channels of parallel output signal $b_1$ through $b_7$ in every T' period. The output signal $S_{11}$ through $S_{17}$ in the first output period T' is the same as the input signal $S_{11}$ through $S_{17}$ in the first input period. The first channel signal at the second output period is $S_{18}$ which is the 8'th channel signal in the first input period, and other channel signals in the second output period are the first 6 channels signals in the input channel. Similarly, 7 signals are output in every T' period.

A rate converter is implemented by 16 flip-flops, which are classified to two groups each having 8 bits. The input signal in parallel form with 8 bits is temporarily stored in each group of flip-flops alternately in every T period. The 7 bits of flip-flops are read out in every T' period, and said 7 bits of flip-flops are shifted by 7 bits in every read operation.

The output of the first rate converter 1 having 7 parallel bits is applied to the convolutional encoder 2, which adds one redundant bit (n=1) to the input bits for error correction purpose, and provides 8 (=m+n) parallel bits in every T' period.

The output of the convolutional encoder 2 is applied to the mapping circuit 3, which locates each 8 bits signal to 256QAM signal considering Euclid length between the codes by using the Set-Partition method. The Set-Partition is described in "Channel Coding with Multilevel/Phase Signals" by G.Ungerboeck, IEEE IT, January 1982 pp55–67.

Figure 5A:
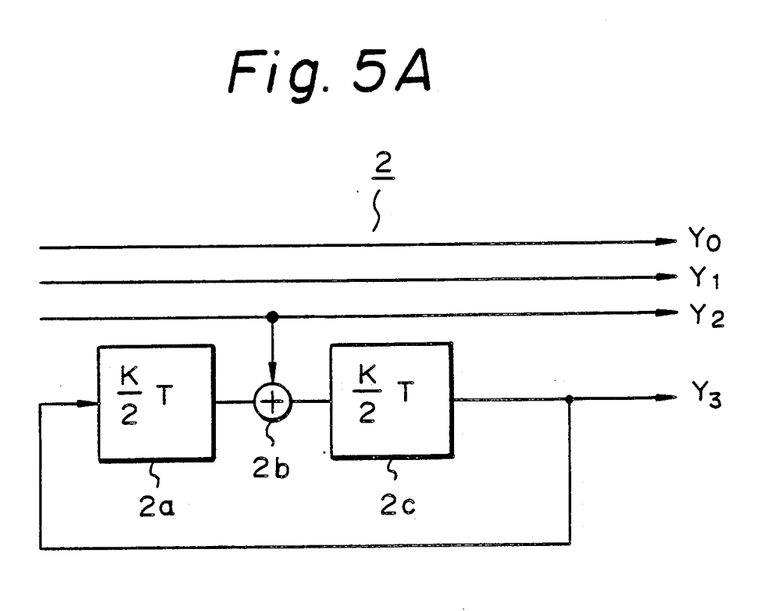
FIG. 5A is a block diagram of an example of an encoder 2 in FIG. 3.
Figure 5B:
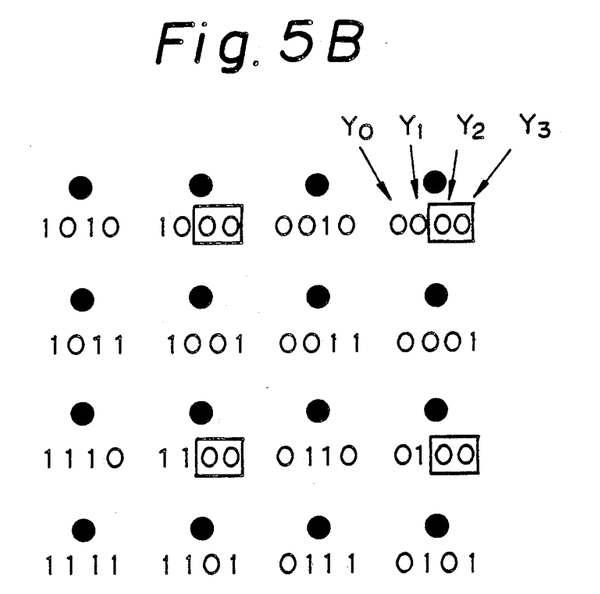
FIG. 5B shows the operation of the encoder of FIG. 5A.

For the sake of the simplicity of the explanation, the example of the convolutional encoder for m=3 and n=1, and the example of the mapping circuit for 16QAM signal are shown in FIGS. 5A and 5B.

In FIG. 5A, three input parallel signals $Y_0$, $Y_1$ and $Y_2$ are applied to the convolutional encoder 2, which has a pair of delay elements 2a and 2c, and an exclusive-OR circuit 2b. The output of the convolutional encoder 2 has four parallel signals $Y_0$, $Y_1$, $Y_2$ and $Y_3$ (m=3, n=1). The outputs $Y_0$, $Y_1$ and $Y_2$ are the same as the respective input signals. The output $Y_3$ is feed-back to the delay element 2a the output of which is applied to the exclusive-OR circuit 2b. The exclusive-OR circuit 2b provides the logical operation of the output of the delay element 2a and the signal $Y_2$, and only when one of them is one, it provides the positive output. The output of the exclusive-OR circuit 2b is applied to the output $Y_3$ through another delay element 2c. The four parallel outputs $Y_0$, $Y_1$, $Y_2$ and $Y_3$ are applied to the mapping circuit 3.

The delay time of the delay elements 2a and 2c is defined by kT/2, where k is dimension (k=2,4,8, ...), and T is clock period. The present invention is not restricted to K=2, but values higher than 2 for k are possible.

The four bit parallel signal has 16 statuses. The amplitude and the phase of each signal in 16QAM signal is defined by a mapping circuit. The example of the mapping for 16QAM signal is shown in FIG. 5B. It should be noted in FIG. 5B that the signal having the same symbols $Y_2$ and $Y_3$ (for instance $y_2 = 0$ and $y_3 = 0$) is located far from another signal which has the same symbol as said $Y_3$ and $Y_4$.

The numeral 8 is a clock rate converter which converts a clock rate in an input signal corresponding to the period T to the clock rate corresponding to the period T'. the converted clock signal is applied to the first rate converter 1, the encoder 2 and the mapping circuit 3.

The output of the mapping circuit is applied to the modulator 4, which provides the radio frequency signal as transmit signal.

Thus, it should be appreciated that the bit rate (=m+n) of an input signal of a mapping circuit 3 is the same as the bit rate of an input digital signal itself to a transmitter. Therefore, even when the convolutional encoder 2 increases the number of bits by n, the symbol spacing on the constellation plane is the same as that of the input signal.

In a receiver side, the received signal which is subject to noise in the radio transmission path is applied to the demodulator 5, which effects the demodulation corresponding to the modulation by the modulator 4. The noise in the radio transmission path is shown by an OR circuit 15.

The output of the demodulator 5 is applied to the decoder 6, which is for instance Viterbi-type decoder, which effects the error correction decoding corresponding to the convolutional encoding by the encoder 2. The output of the decoder 6 is applied to the second rate converter 7, which converts the period T' to T. Thus, the digital output signal having m+n bit/T is obtained at the output of the second rate converter 7.

The numeral 10 is a clock recovery circuit which recovers the clock signal of the period T'.

The Viterbi-decoder 6 operates with the clock period a T', and provides m bits parallel signal in every T' period. The second rate converter receives the output of the decoder 6 (m parallel bits in T' period), and provides m+n parallel bits in every T period. The numeral 9 is a clock rate converter for converting the recovered clock rate T' to the original clock rate T.

The dotted portion including a rate converter, a convolutional encoder, a mapping circuit and a clock rate converter in FIG. 1A, and the dotted portion including a Viterbi-decoder, a clock recovery circuit, a rate converter and a clock rate converter in FIG. 3B are possible to be in a single chip LSI, respectively.

Figure 6:
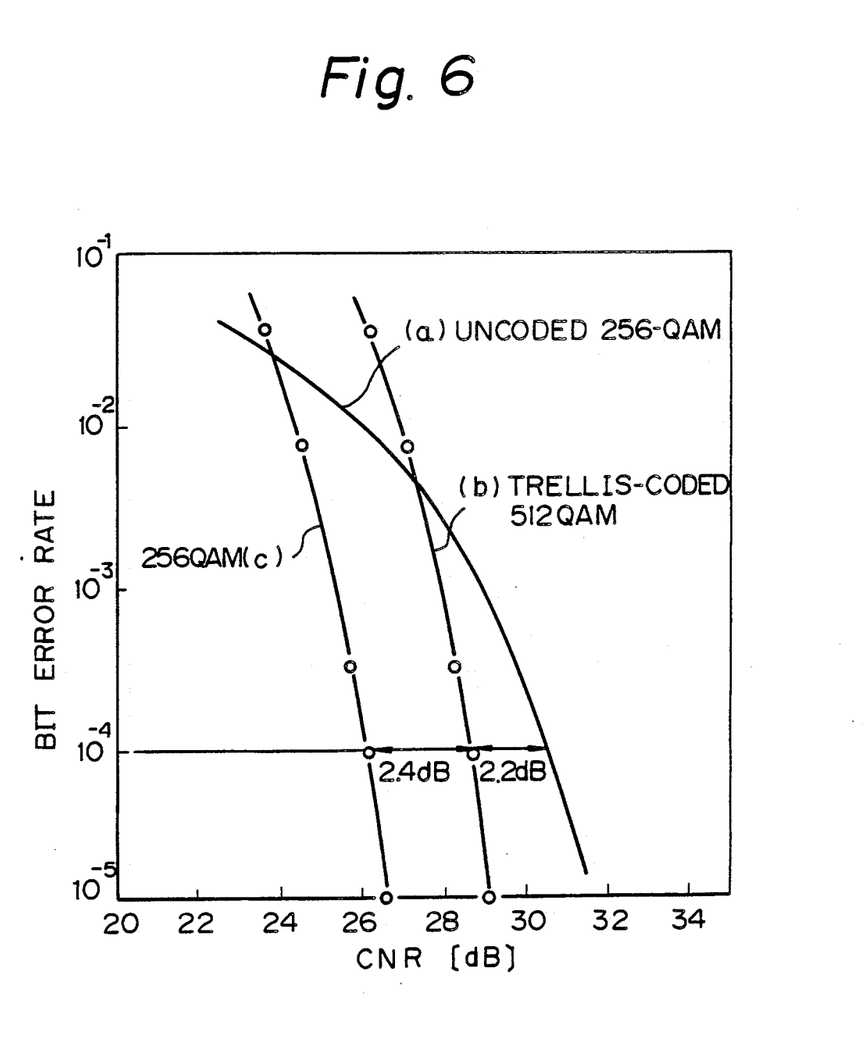
FIG. 6 shows curves between C/N and bit error rate in the present invention, a prior coded modulation system, and uncoded system.

Now, the effect of the present invention is described in accordance with FIG. 6.

In FIG. 6, the horizontal line shows the carrier to noise ratio (C/N) in dB for obtaining the bit error rate in the vertical axis.

The curve (a) shows the case of uncoded 256QAM signal in which no mapping circuit is used.

The curve (b) shows the case of Trellis-coded 512QAM signal in which the prior circuit of FIG. 1 having the mapping circuit is used. The uncoded 256QAM signal is converted to 512QAM signal in this case because of the additional bit for error correction purposes. The curve (b) is better than the curve (a), when the C/N is better than 27 dB.

The curve (c) shows the characteristics of the present invention, in which the rate converters and the mapping circuit are used.

It should be noted in FIG. 6 that when the bit error rate is $10^{-4}$, the coding gain of the curve (b) is 2.2 dB as compared with the uncoded signal. The coding gain of the present invention in the curve (c) is better than the curve (b) by 2.4 dB. Therefore, the total coding gain of the present invention as compared with the uncoded 256QAM signal is 4.6 dB.

Because of the use of the rate converters, the dimension (256QAM) in the present invention does not increase in spite of the use of a convolutional encoder which adds an additional bit for error correction.

The coding gain is analyzed as follows.

Figure 3:
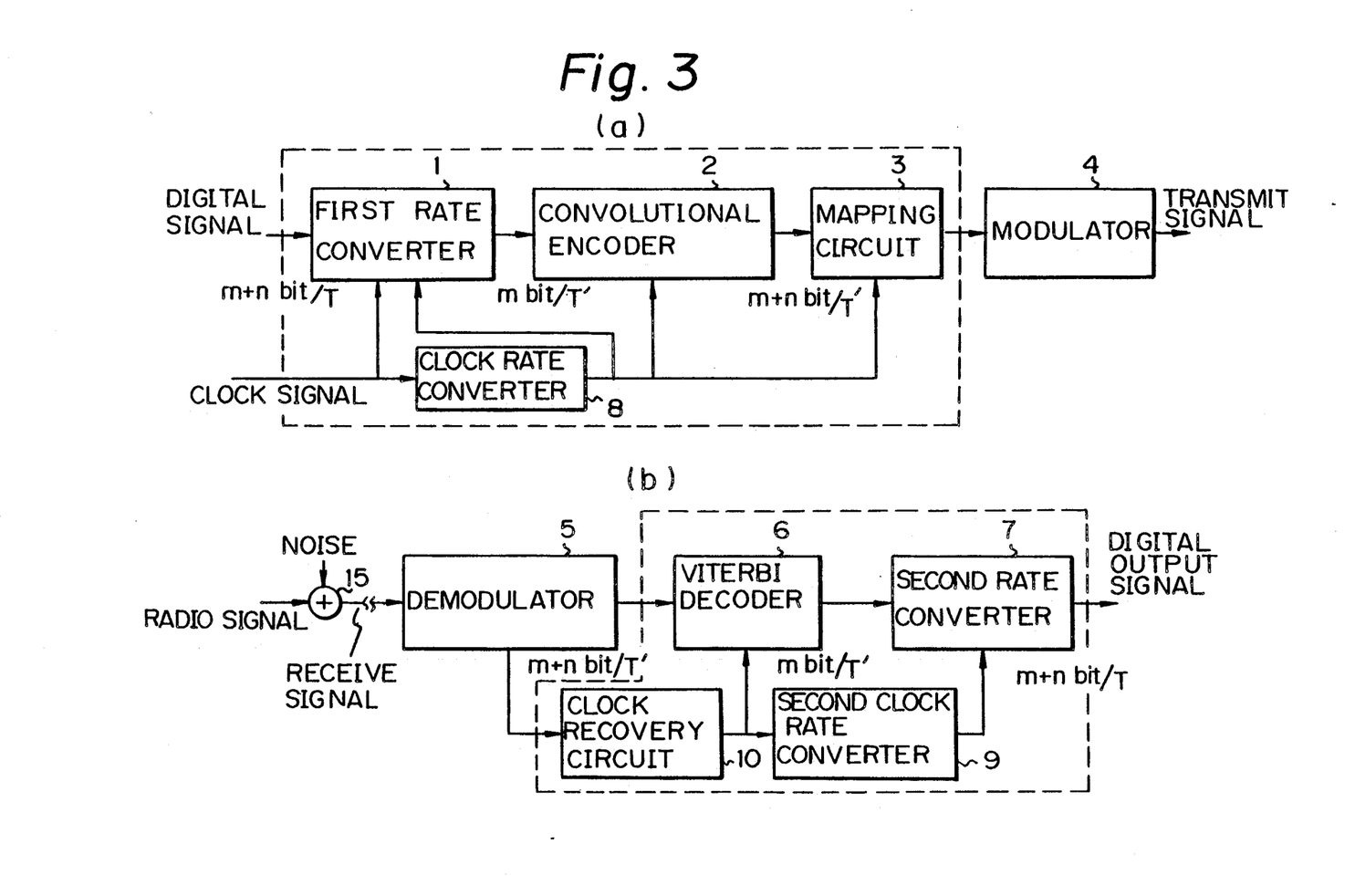
FIG. 3 is a block diagram of the coded modulation system according to the present invention.

The coding gain by the use of a mapping circuit is supposed to be 5.2 dB in both the prior art in FIG. 1, and the present invention in FIG. 3.

The prior art of FIG. 1 has the decrease of the coding gain by 3.0 dB, because of the increase of the dimension from 256QAM signal to 512QAM signal. So, the total coding gain in the prior art in FIG. 1 is 2.2 (=5.2−3.0) dB.

In the present invention, no decrease of the coding gain because of the dimension exists. However, the bandwidth for the transmission in the present invention increases, since the bit rate in the present invention increases. The increase of the bandwidth is 8/7 when 256QAM signal (8 bits code) concerns. The increase of the bandwidth by 8/7 decreases the noise ratio by 0.6 dB. The total coding gain in the present invention is 4.6 (=5.2−0.6) dB.

From the foregoing it will now be apparent that a new and improved coded modulation system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A coded modulation communication system comprising a transmitter for providing a coded modulations signal; and a receiver for obtaining and reproducing the signal by demodulating and decoding the signal received from said transmitter wherein said transmitter has a first rate converter which receives an input digital signal having a first clock rate in parallel form having a first number of bits in every first period for converting the first clock rate of said digital signal to a second clock rate which is higher than said first clock rate, and for providing an output signal in parallel form having a second number of bits in every second period wherein said first number of bits is larger than said second number of bits, and said first period is longer than said second period, a convolutional encoder coupled with the output signal of said first rate converter for encoding said second number of bits by adding an additional bit so that a total number of parallel bits at an output of the convolutional encoder is equal to said first number of bits, a mapping circuit coupled with the output signal of said convolutional encoder for determining amplitude and phase of each said output signal on a modulated signal space, and a modulator coupled with an output of said mapping circuit for providing a modulated signal for transmission, and further said receiver has a demodulator for receiving and demodulating said modulated signal from said transmitter, a decoder coupled with an output of said demodulator for decoding the the output of said demodulator originally encoded by said convolutional encoder and for providing a decoded digital signal in parallel form having said second number of bits in every said second period, a second rate converter coupled with said decoded digital signal from said decoder for converting a clock rate of said decoded digital signal from said second clock rate to said first clock rate and for providing a digital output signal in parallel form having said first number of bits in every first period.

2. A coded modulation communication system according to claim 1, wherein said convolutional encoder has a plurality of delay elements coupled in series with one another and an exclusive-OR circuit inserted between said delay elements for receiving one of said parallel bits, such that an output of said plurality of delay elements provides said additional bit and is coupled as a feedback input to a first of said delay elements.

3. A coded modulation communication system according to claim 2, wherein a total delay time of said delay elements is essentially equal to said first period.

4. A coded modulation communication system according to claim 2, wherein a total delay time of said delay elements is essentially equal to an integer multiple of said first period.

5. A coded modulation communication system according to claim 1, wherein said first number of parallel bits is 8, and said second number of parallel bits is 7.

6. A transmitter for a coded modulation communication system comprising:

a rate converter which receives an input digital having a first clock rate signal in parallel form having a first number of bits in every first period for converting the first clock rate of said digital signal to a second clock rate which is higher than said first clock rate, and for providing an output signal in parallel form having a second number of bits in every second period wherein said first number of bits is larger than said second number of bits, and said first period is longer than said second period, a convolutional encoder coupled with the output of said rate converter for encoding said second number of bits by adding an additional bit so that a total number of parallel bits at an output of the convolutional encoder is equal to said first number of bits, a mapping circuit coupled with the output signal of said convolution encoder for determining amplitude and phase of each said output signal on a modulated signal space, and a modulator coupled with an output of said mapping circuit for providing a modulated signal for transmission.

7. A receiver for a coded modulation communication system comprising:

a demodulator for receiving and demodulating a modulated signal from a transmitter, a decoder coupled with an output of said demodulator for decoding the the output of said demodulator originally encoded in the transmitter and for providing a decoded digital signal in parallel form having a first number of bits in a first period, a rate converter coupled with said decoded digital signal from said decoder for converting a first clock rate of said decoded digital signal from said first clock rate to a second clock rate and for providing a digital output signal in parallel form having a second number of bits in a second period, wherein said second period is longer than said first period, said second number of bits is larger than said first number of bits, and said first clock rate is higher than said second clock rate.

8. A coded modulation communication system according to claim 1, wherein a ratio of said first number of bits of said input signal to said second number of bits of said output signal is the same as another ratio of said first period of said input signal to said second period of said output signal.

9. A coded modulation communication system according to claim 1, wherein said mapping circuit determines an amplitude and phase of each signal on a signal space so that a Euclid length between signals is maximum.

* * * * *